United States Patent [19]

Oku et al.

[11] Patent Number: 5,041,899

[45] Date of Patent: Aug. 20, 1991

[54] INTEGRATED CIRCUIT DEVICE HAVING AN IMPROVED PACKAGE STRUCTURE

[75] Inventors: Akihiro Oku; Souichi Aonuma, both of Kawasaki; Tetsushi Wakabayashi, Yokohama, all of Japan

[73] Assignees: Fujitsu Limited, Kawasaki; Fujitsu VLSI Limited, Kasugai, both of Japan

[21] Appl. No.: 362,525

[22] Filed: Jun. 7, 1989

[30] Foreign Application Priority Data

Jun. 8, 1988 [JP] Japan .................. 63-139424
May 26, 1989 [JP] Japan .................. 1-133243

[51] Int. Cl.$^5$ ............... H01L 23/02; H01L 23/12
[52] U.S. Cl. ........................... 357/74; 351/80; 361/394
[58] Field of Search ............................. 357/74

[56] References Cited

U.S. PATENT DOCUMENTS

| | | | |
|---|---|---|---|
| 4,141,030 | 2/1979 | Eisele et al. | 357/74 |
| 4,338,621 | 7/1982 | Braun | 357/74 |
| 4,387,388 | 6/1983 | Zakhariya | 357/74 |
| 4,482,781 | 11/1984 | Burns | 357/74 |
| 4,513,355 | 4/1985 | Schroeder et al. | 357/74 |
| 4,608,592 | 8/1986 | Miyamoto | 357/74 |
| 4,724,472 | 2/1988 | Sugimoto et al. | 357/74 |
| 4,839,717 | 6/1989 | Phy et al. | 357/74 |
| 4,918,513 | 4/1990 | Kurose et al. | 357/74 |

FOREIGN PATENT DOCUMENTS

| | | |
|---|---|---|
| 0261013 | 3/1988 | European Pat. Off. . |
| 0346061 | 12/1989 | European Pat. Off. . |
| 57-201054 | 12/1982 | Japan ................... 357/74 |
| 181651 | 10/1984 | Japan . |
| 60-7152 | 1/1985 | Japan . |
| 0177763 | 8/1986 | Japan ................... 357/74 |
| 0136057 | 6/1987 | Japan ................... 357/74 |
| 0062364 | 3/1988 | Japan ................... 357/74 |
| 63-305542 | 12/1988 | Japan . |
| 1-199460 | 8/1989 | Japan . |

Primary Examiner—William D. Larkins
Assistant Examiner—Viet Q. Nguyen
Attorney, Agent, or Firm—Staas & Halsey

[57] ABSTRACT

An integrated circuit device includes a package having first and second surfaces and first and second internal connection lines. A semiconductor integrated circuit chip is mounted on the first surface of the package. A first group of external connection terminals is provided on the first surface of the package, and is electrically connected to the semiconductor integrated circuit chip through the first internal connection lines. A second group of external connection terminals is provided on the second surface of the package so as to form a matrix arrangement of terminals, and is electrically connected to the semiconductor integrated circuit chip through the second internal connection lines. The second group of external connection terminals includes specific terminals specifically passing signals to be supplied to or from the semiconductor integrated circuit chip. The signals passing through the specific terminals are signals used at the time of evaluating the semiconductor integrated circuit chip.

26 Claims, 8 Drawing Sheets

FIG. IA
PRIOR ART
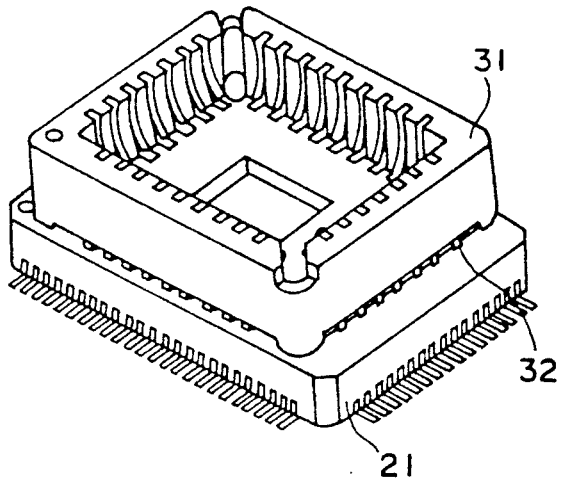
FIG. IB
PRIOR ART
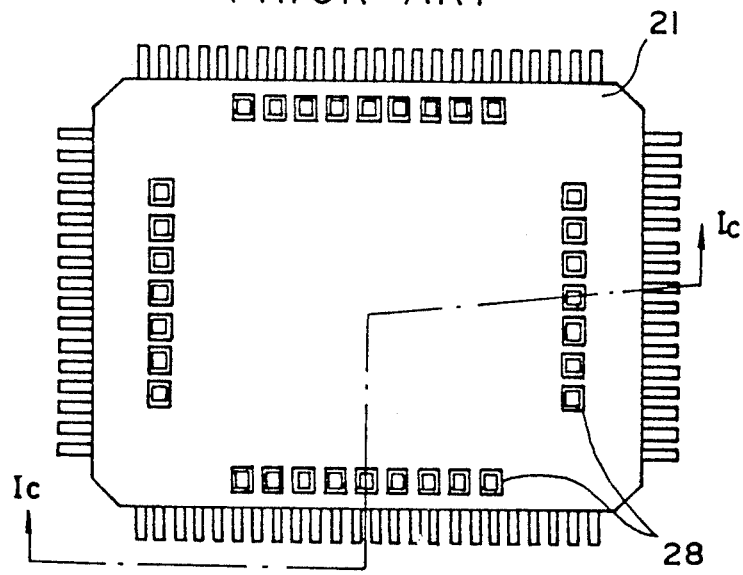
FIG. IC
PRIOR ART
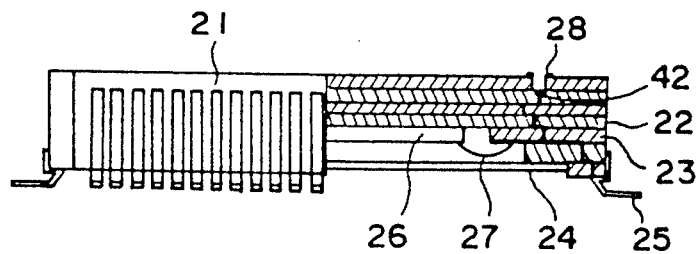

INTEGRATED CIRCUIT DEVICE HAVING AN IMPROVED PACKAGE STRUCTURE

BACKGROUND OF THE INVENTION

The present invention generally relates to an integrated circuit device having an improved package structure, and particularly to an improvement of a package structure on an integrated circuit chip is mounted and which is used at the time of developing and verifying a program written into the integrated circuit chip or confirming operation of a system having the integrated circuit device. The present invention is suitable for developing and evaluating an application specific integrated circuit digital signal processor (ASIC DSP), microprocessor or the like.

As is well known, an integrated circuit chip such as a digital signal processor and a microprocessor, has a memory which is left open for programming by users so as to construct a desired circuit. Generally, an erasable programmable read only memory (hereinafter simply referred to as an EPROM) is used as a memory provided in an application specific processor.

A piggy back package is a well-known package, and has a socket, which is mounted on top of the package body. The socket has first terminals coupled to terminals provided in the package body, and second terminals to be coupled to a plug having a terminal arrangement identical to that of the second terminals. An integrated circuit chip accommodated in the package body is coupled to a tool such as a debugger and an emulator through the socket, plug and cable. In this state, it is possible to monitor the state of internal memories and registers as exist before and after executing an instruction, for example.

FIGS. 1A, 1B and 1C illustrate a conventional piggy back type package. The illustrated package includes a package body 21, and a leadless chip carrier type socket 31 which is mounted on top of the package body 21. The package body 21 is made up of a plurality of stacked ceramic layers. A semiconductor chip 26, in which an integrated circuit is formed, is provided in a chip mounting layer 22 which is one of the stacked ceramic layers. On the side of the package body 21, facing a printed circuit board on which it is to be mounted, there are provided a plurality of external connection terminals 25 to be connected to wiring lines formed on the printed circuit board. On the same side of the package body 21, there is provided a cap 24 used for hermetically sealing the chip 26. On the other side of the package body 21, there are provided pin receiving members 28, which is to engage with socket pin terminals 32 provided in the socket 31. The socket pin terminals 32 and the corresponding pin receiving members 28 are mutually connected by soldering.

The package body 21 includes conductive patterns 42, which serve as wiring lines or internal connection lines, and are connected to the related external connection terminals 25 and the pin receiving members 28. The internal connection lines 42 extend up to a surface of a wire bonding layer 23. Bonding wires 27 connect the internal connection lines 42 and related bonding pads formed on the surface of the wire bonding layer 23.

FIG. 2 illustrates another conventional piggy back type package. The illustrated package includes a package body 71 having a plurality of stacked ceramic layers into which a silicon semiconductor chip is accommodated. The package body 71 is provided with a plurality of external connection terminals 72 and pin receiving members, with which pin terminals of a socket 81 engage. Each of the external connection terminals 72 is in the form of a pin, which is inserted into a corresponding through hole formed in a printed circuit board.

The above-mentioned packages may be provided with some improvements. For example, an improvement is that the package bodies 21 and 71 are miniaturized in order to enhance the element mounting density. Another improvement is to employ a large size socket to thereby attain an increased number of terminals used for evaluating the chip. Still another improvement is that the outer diameter of the package body 21, 71 is set equal to that of the socket 31, 81 in order to satisfy both the miniaturization of the package body and increase of the size of the socket.

However, the increase of the number of terminals used for the chip evaluation encounters a problem such that the socket projecting outside the package body prevents other electrical circuit elements from being mounted on the same printed circuit board. This leads to a decrease of the element mounting density. Additionally, it is desired that the package body is as small as possible to enhance the element mounting density. From the above-mentioned reasons, it is actually impossible to provide a large number of terminals used for the development and evaluation of integrated circuit chips.

The package illustrated in FIGS. 1A through 1C is designed to visually investigate the contact state of the socket pin terminals 32 and the pin receiving members 28 through a gap between the neighboring socket pin terminals 32. Therefore, an increase of the number of socket pin terminals 32 causes difficulty in the visual investigation. As a result, it becomes impossible to visually investigate a failure of soldering contacts.

SUMMARY OF THE INVENTION

It is therefore a general object of the present invention to provide an integrated circuit device having an improved package structure in which the aforementioned disadvantages are eliminated.

A more specific object of the present invention is to provide an integrated circuit device having an improved package structure for mounting an integrated circuit chip capable of providing a large number of external connection terminals mounted on a side of the chip opposite to a side thereof facing a printed circuit board and visually investigating the contact state of the external connection terminals and a plug with ease.

The above objects of the present invention can be achieved by an integrated circuit device constructed as follows. An integrated circuit device includes a package having first and second surfaces and first and second internal connection lines. A semiconductor integrated circuit chip is mounted on the first surface of the package. A first group of external connection terminals is provided on the first surface of the package, and is electrically connected to the semiconductor integrated circuit chip through the first internal connection lines. A second group of external connection terminals is provided on the second surface of the package so as to form a matrix arrangement of terminals, and is electrically connected to the semiconductor integrated circuit chip through the second internal connection lines. The second group of external connection terminals includes specific terminals specifically passing signals to be supplied to or from the semiconductor integrated circuit chip. The signals passing through the specific terminals are signals used at the time of evaluating the semiconductor integrated circuit chip.

The above-mentioned objects of the present invention can also be achieved by an integrated circuit device constructed as follows. A package body has first and second surfaces opposite to each other and first and second internal connection lines, and accommodates a semiconductor integrated circuit chip on the first surface thereof. A first group of external connection terminals is provided on the second surface of the package body, and is electrically connected to the semiconductor integrated circuit chip through the first internal connection lines. A metallized insulating cap has third internal lines and is mounted on the package body so that the first surface of the metallized insulating cap faces the first surface of the package body. A second group of external connection terminals is mounted on the second surface of the metallized insulating cap, and is electrically connected to the semiconductor integrated circuit chip through the second and third internal connection lines. The second group of external connection terminals includes specific terminals specifically passing signals to be supplied to or from the semiconductor integrated circuit chip. The signals passing through the specific terminals are signals used at the time of evaluating the semiconductor integrated circuit chip.

Other objects, features and advantages of the present invention will become apparent from the following detailed description when read in conjunction of the accompanying drawings.

BRIEF DESCRIPTION OF THE DRAWINGS

FIG. 1A is a perspective view of a conventional piggy back type package;

FIG. 1B is a plan view of the package of FIG. 1A;

FIG. 1C is a view taken along the line $I_C$—$I_C$ shown in FIG. 1B;

DESCRIPTION OF THE PREFERRED EMBODIMENTS

Figure 2:
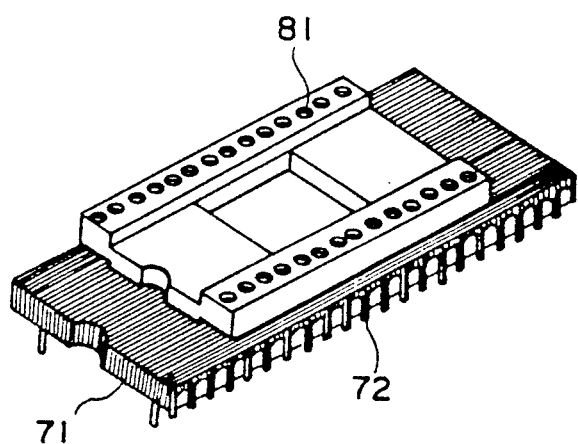
FIG. 2 is a perspective view of another conventional piggy back type package.

A description is given of a preferred embodiment of the present invention with reference to FIGS. 3A through 3D. Referring to these figures, a package body 11 is made up of a plurality of ceramics layers. A chip mounting layer 12 is the uppermost layer in the structure shown in FIGS. 3C and 3D. The package body 11 also has a wire bonding layer 13, a cap 14, and external connection terminals 15, which are arranged in this order from the chip mounting layer 12. That is, the wire bonding layer 13 is positioned at a level lower than the chip mounting layer 12, and the cap 14 is positioned at a level lower than the wire bonding layer 13. The external connection terminals 15 are positioned at a level lower than the cap 14. A semiconductor integrated circuit chip 16 (hereafter simply referred to as a chip) such as a silicon chip is fastened to the chip mounting layer 12. On the wire bonding layer 13, there are formed two stacked ceramics layers 13-1 and 13-2 served a internal connection layers. Bonding pads formed on the chip 16 are electrically connected to related bonding pads formed on the wire bonding layer 13 through bonding wires 17.

A metallized insulating layer 41 is mounted on the surface of the package body 11 opposite to or remote from, the cap 14. A predetermined number of pin-shaped external connection terminals 18 is mounted by brazing, for example, on the metallized insulating layer 41 so as to elevationally project therefrom i.e., to project from the surface of the layer 41 in a direction generally perpendicular to that surface. The external connection terminals 18 are arranged so as to form a matrix. The external connection terminals 18 include power supply terminals 18-1 and evaluation dedicated terminals 18-2. The power supply terminals 18-1 are positioned in the four corners of the matrix arrangement of external connection terminals. The metallized insulating layer 41 is made up of three ceramic layers 41-1, 41-2 and 41-3 stacked in that order. Through holes 41a are formed in the layers 41-1, 41-2 and 41-3, and internal connection lines 41b are formed on surfaces of the layers 41-1, 41-2 and 41-3. The through holes 41a are filled with a conductive material. This conductive material formed in the through holes serves as a part of the internal connection lines 41b. Similarly, through holes 12a and internal connection lines 12b are provided in and on the chip mounting layer 12. Further, through holes 13a filled with a conductive material are formed in the wire bonding layer 13 and serve as a part of internal connection lines 13b formed on surfaces of the layers 13-1 and 13-2.

Figure 3A:
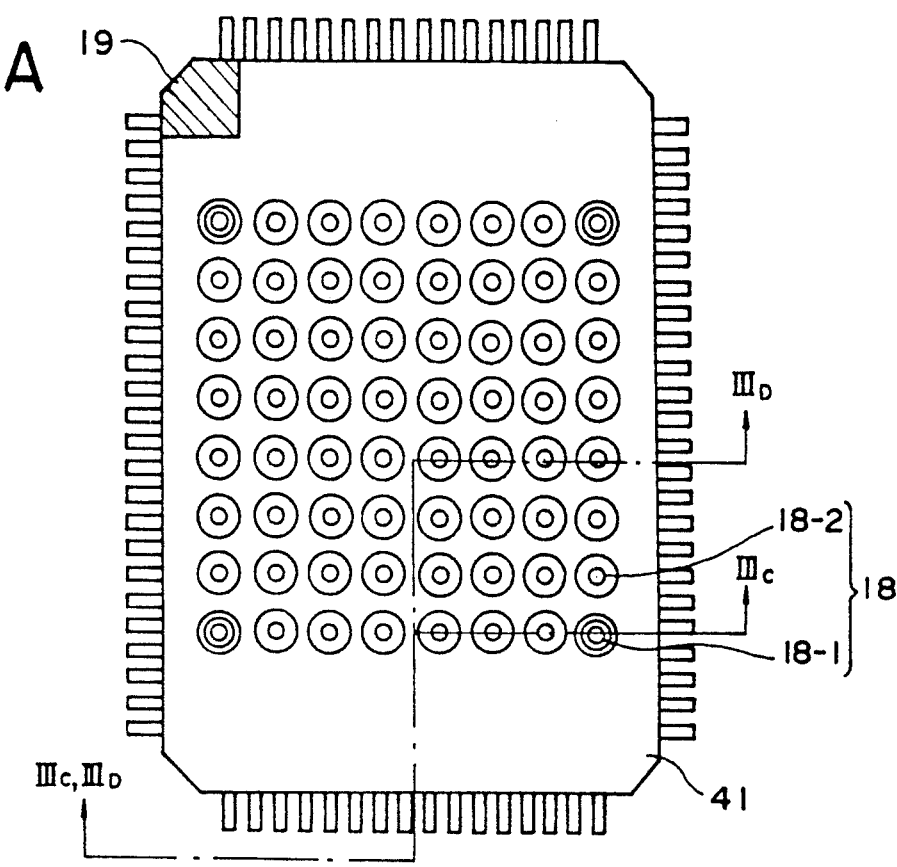
FIG. 3A is a plan view of a preferred embodiment of the present invention.
Figure 3B:
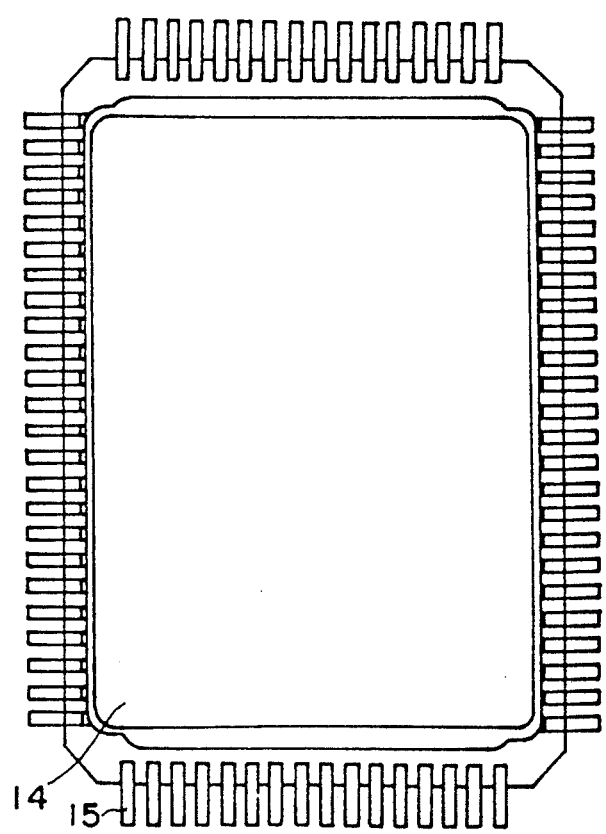
FIG. 3B is a bottom view of the embodiment shown in FIG. 3A.
Figure 3C:
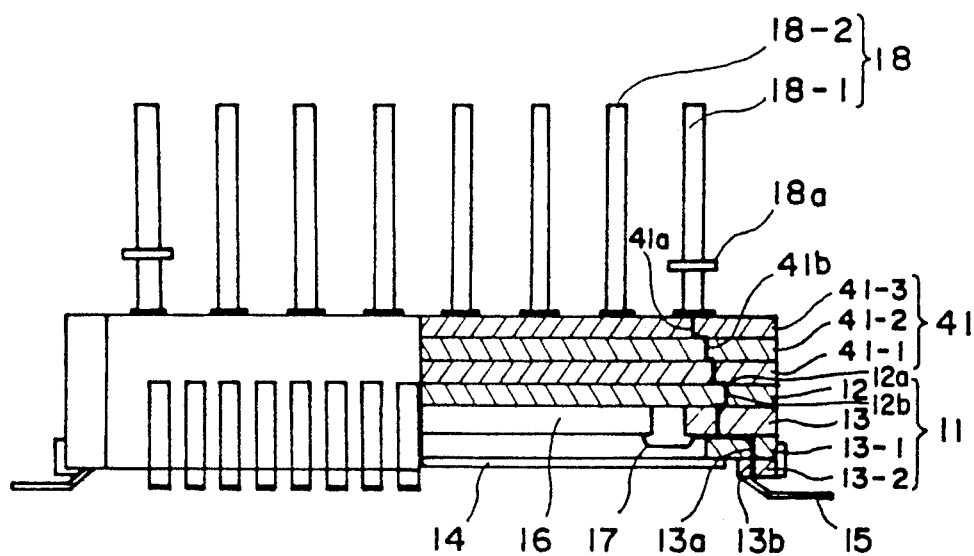
FIG. 3C is a view taken along the line $III_C$—$III_C$ shown in FIG. 3A.
Figure 3D:
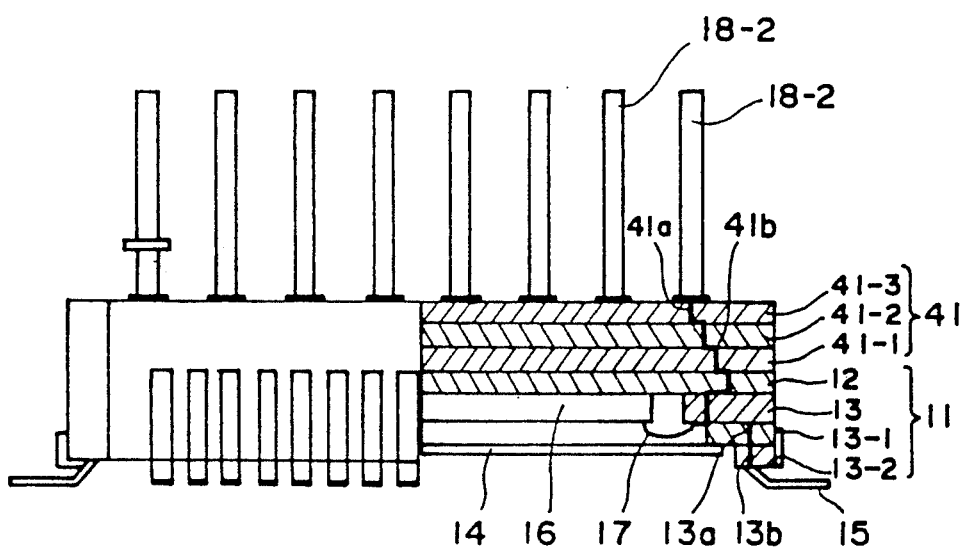
FIG. 3D is a view taken along the line $III_D$—$III_D$ shown in FIG. 3A.

As is clearly shown in FIG. 3C, the power supply terminals 18-1 are connected to related bonding pads formed, on the chip 16 and to corresponding power supply terminals of the external connection terminals 15 through the internal connection lines 41b and 13b, respectively. On the other hand, as shown in FIG. 3D, the evaluation dedicated terminals 18-2 are connected to related bonding pads formed on the chip 16 through the internal connection lines 41b, but are not connected in common to the external connection terminals 15. This means that the evaluation dedicated terminals 18-2 are electrically isolated from, and thus operationally independent of, the external connection terminals 15. The external connection terminals 15 are terminals used for normal operation. On the other hand, the external connection terminals 18-2 are terminals used at the time of developing and evaluating integrated circuits formed on the chip 16.

In the case that the package body 11 accommodates a chip forming a digital signal processor, the evaluation dedicated terminals 18-2 pass signals such as a holt signal, holt acknowledge signal, clock used for single step operation, debug enable signal, program mode select signal, real/write signal used at the time of holt, register rewriting signal used at the time of holt, external access ready signal used at the time of holt, internal/external instruction switching signal, program address input/output signal, and program data input/output signal.

The external connection terminals 18 are arranged in a grid array method so as to form the matrix arrangement. At a minimum, the external connection terminals 18 consist of at least two rows and two columns. For example, the external connection terminals 18 consists of 64 terminals each having a diameter of 0.4 mm, a length of 4.6 mm, and are partitioned in 8 columns each consisting of 8 terminals. A pitch between the neighboring terminals is set equal to 1.778 mm (70 mil), for example. Alternatively, it is possible to arrange the external connection terminals 18 in a different desired arrangement. The external connection terminals 18 are made of a conductive material such as an alloy of iron or nickel, and an alloy of iron, nickel and cobalt. The external connection terminals 18 are mounted on the metallized insulating layer 41 as follows. A conductive layer such as a tungsten layer is formed, by screen printing, on the layer 41-3 of the metallized insulating layer 41 made of alumina ceramic. A conductive layer consisting of a nickel plating layer and a gold plating layer, for example, is laminated in this order on the tungsten layer. The external connection terminals 18 are fastened to the above-mentioned conductive layer by brazing, for example. Thereafter, a nickel plating layer is formed around the surfaces of the external connection terminals 18. The power supply terminals 18-1 positioned in the corners of the arrangement are provided with stoppers 18a. An index mark 19 indicating the first pin position is formed in one corner of the metallized insulating layer 41.

Figure 4:
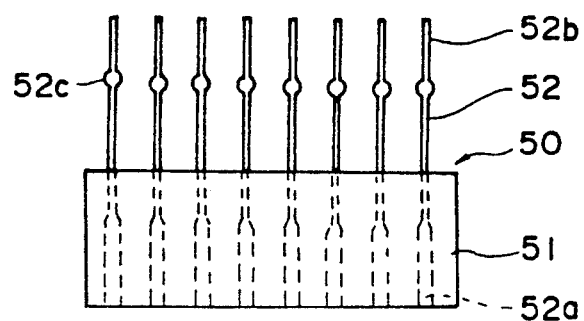
FIG. 4 is a side view of a socket to be coupled with external connection terminals which elevationally project from a metallized insulating layer of the embodiment shown in FIGS. 3A through 3D.
Figure 5:
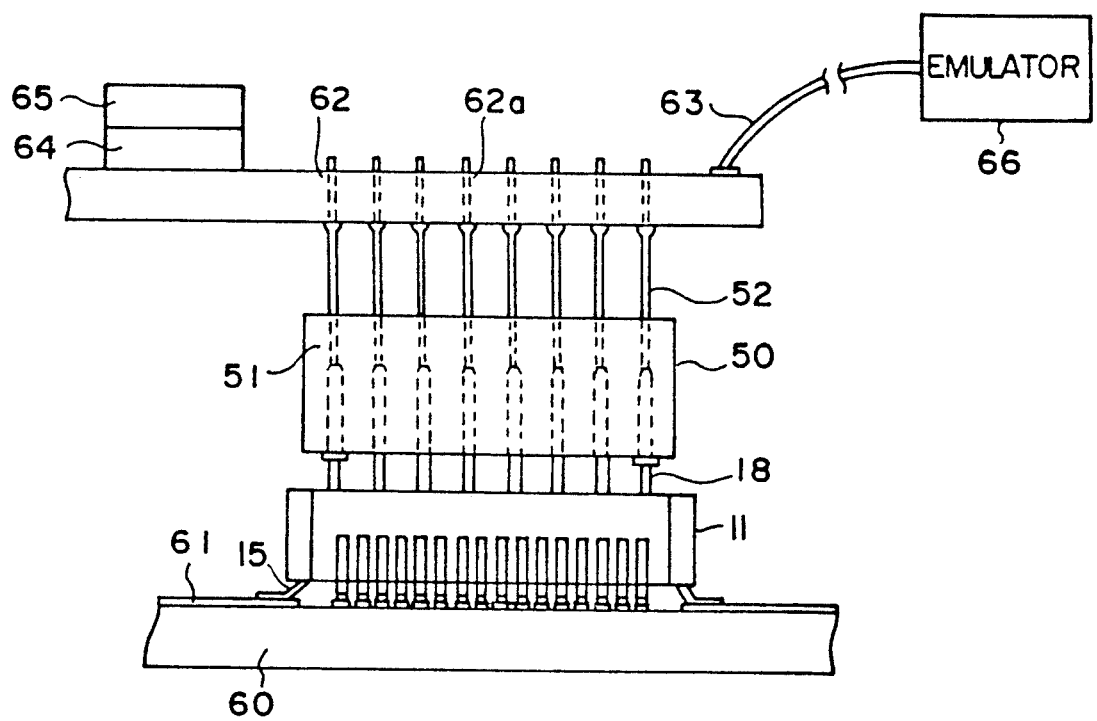
FIG. 5 is a side view illustrating the evaluation state.

Referring to FIG. 4, a socket 50 is attached to the external connection terminals 18. FIG. 5 illustrates an evaluation state where the socket 50 having an insulator plate 51 is attached to the external connection terminals 18. In this evaluation state, a variety of evaluation tests may be done. As illustrated in FIGS. 4 and 5, terminals 52 having pin receiving members 52a and projections 52b are fastened to the socket 50. The pin receiving members 52 have the same arrangement pattern as the external connection terminals 18. Each of the terminals 52 has a stopper 52c.

The external connection terminals 15 of a package body 11 having a chip 16 therein (FIGS. 3C and 3D) are connected, by soldering, to wiring patterns 61 formed on a surface of a printed circuit board 60 as shown in FIG. 5. On the other hand, the socket 50 is attached to the external connection terminals 18 including the power supply terminals 18-1 and the evaluation dedicated terminals 18-2. The terminals 52 are inserted into corresponding pin receiving members 62a formed in an insulator plate 62 of an emulation board. Wiring patterns (not shown in FIG. 5) connected to the pin receiving members 62a are formed on a surface of the insulator plate 62. On the same surface, there is provided a piggy back type socket 64 connected to the wiring patterns. A semiconductor device 65 such as a program writer is mounted on the socket 64. The wiring patterns are also connected to an emulator or debugger 66 through a coaxial cable 63. In this state, the chip 16 is subjected to a variety of processing for development, evaluation and debug.

The chip 16 forms a digital signal processor which includes a programmable memory having an address length of 16 bits and an instruction length of a maximum of 30 bits, for example. In order to evaluate such a digital signal processor, it is required to use evaluation dedicated terminals 18-2 amounting to a maximum of 46 bits. As described previously, the evaluation dedicated terminals 18-2 are used for inputting various instructions of a program for use in evaluation supplied from the emulator 66 and outputting addresses being executed thereto.

According to the present invention, it is possible to provide a number of evaluation dedicated terminals without increasing the package body. Additionally it is easy to visually investigate the contact state. Therefore, the present invention is optimum to semiconductor chips which are required to use many evaluation dedicated terminals. Further, the present invention contributes to miniaturizing the package accommodating a processor handling a large amount of address and data information.

Figure 6:
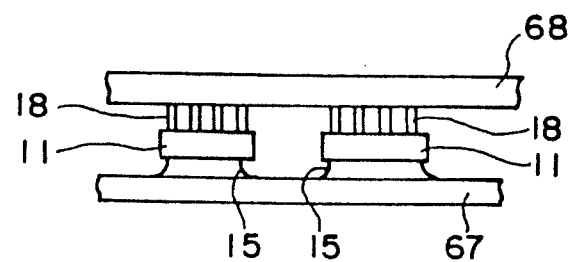
FIG. 6 is an application of the embodiment of the present invention.

In the alternative, it is possible to employ pin-shaped terminals in place of the external connection terminals 15 of the leadless type. Also, the external connection terminals 18 may be used as terminals open to users like the external connection terminals 15. Such an alternative is illustrated in FIG. 6. Referring to FIG. 6, the external connection terminals 15 extending from the packages 11 are mounted on a printed circuit board 67, and the external connection terminals 18 are inserted into corresponding holes formed in a printed circuit board 68 so that the packages 11 are sandwiched between the printed circuit boards 67 and 68.

Figure 7A:
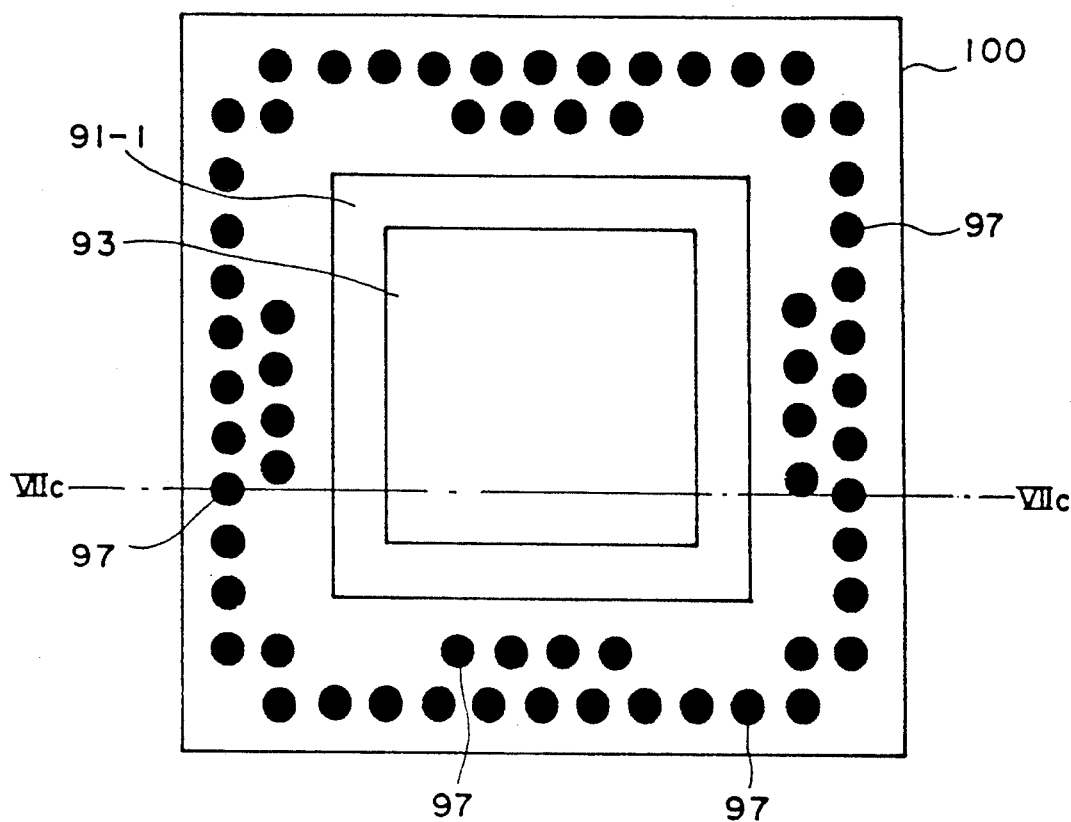
FIG. 7A is a plan view of a package body used in a second preferred embodiment of the present invention.
Figure 7B:
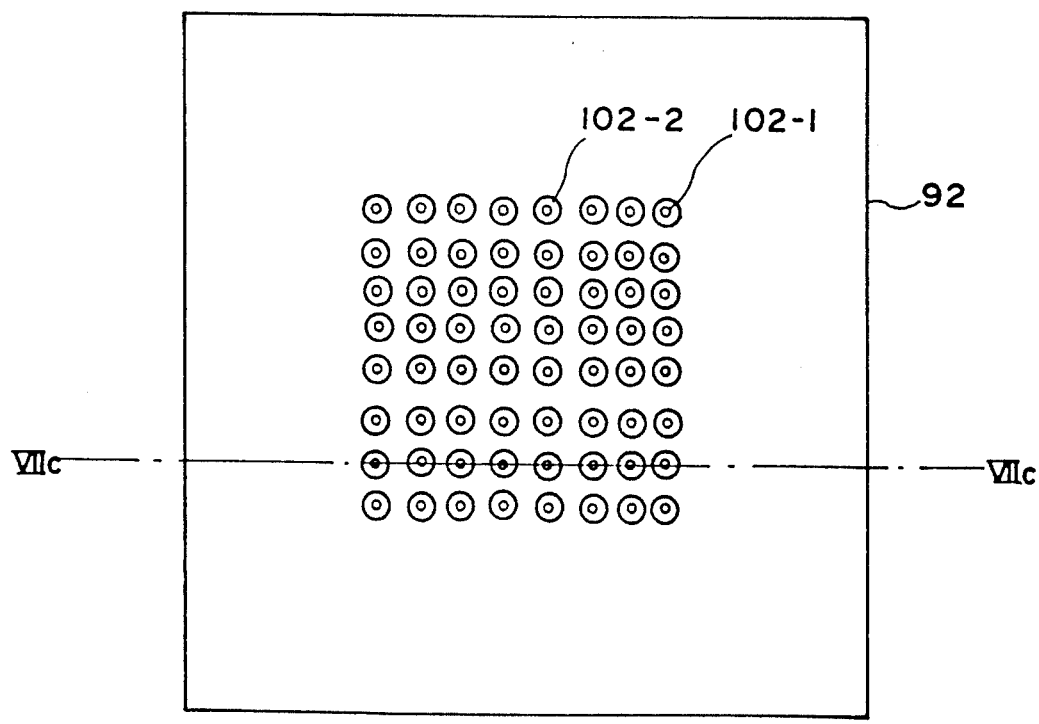
FIG. 7B is a plan view of a metallized insulating cap used in the second embodiment.
Figure 7C:
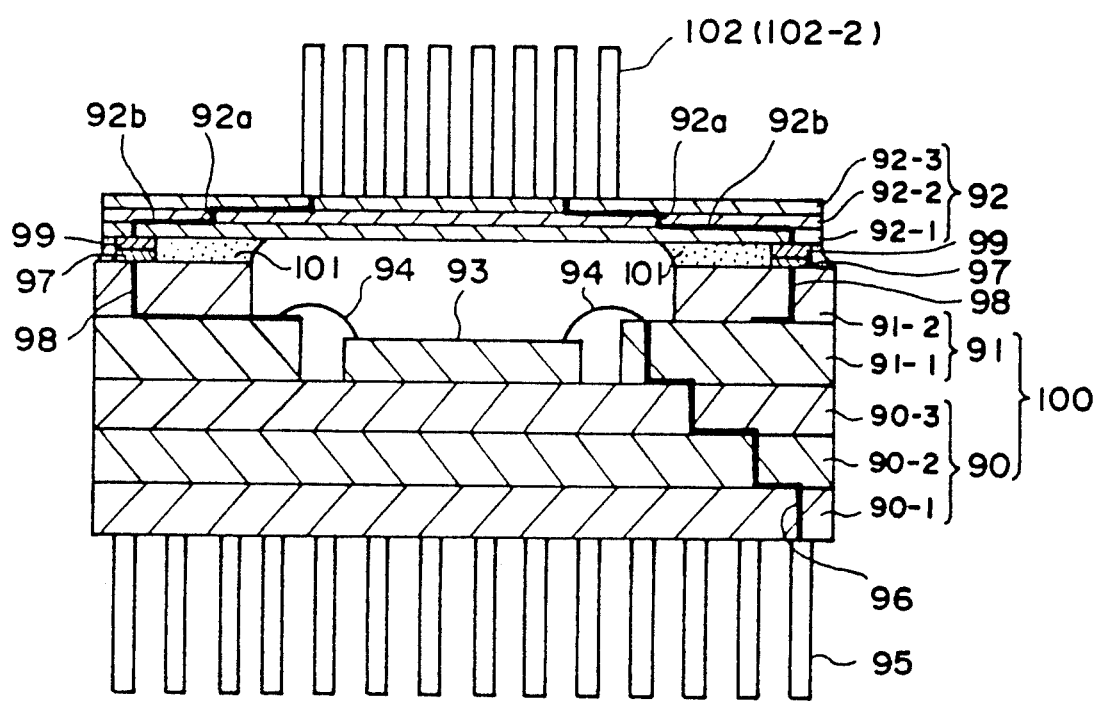
FIG. 7C is a cross sectional view taken along the lines $VII_C$—$VII_C$ shown in FIGS. 7A and 7B, in which the package body of FIG. 7A and the metallized insulating cap of FIG. 7B are assembled.

A description is given of a second preferred embodiment of the present invention. Referring to FIGS. 7A through 7C, there is illustrated the second preferred embodiment of the present invention. The illustrated structure includes a package body 100 and a metallized insulating cap (layer) layer 92. The package body 100 is made up of a package mounting layer 90 consisting of three stacked layers 90-1, 90-2 and 90-3, and a wire bonding layer 91 consisting of two stacked layers 91-1 and 91-2. Each layer of the package body 100 is formed of ceramics, for example. A semiconductor integrated circuit chip 93 such as a silicon chip is mounted on the layer 90-3 of the package mounting layer 90. Bonding pads formed on the chip 93 are electrically connected, through bonding wires 94, to bonding pads formed on the layer 91-1 of the wire bonding layer 91. A plurality of external connection terminals 95 are mounted on the layer 90-1 of the package mounting layer 90 so as to project elevationally (i.e., perpendicularly, or normally)

therefrom. The external connection terminals 95 are connected to related circuits formed on the chip 93 through the bonding wires 94, and internal connection lines 96 formed in the package mounting layer 90. Of course, the internal connection lines 96 pass through each layer of the package body 100 via through holes formed therein. The external connection terminals 95 consist of 64 or more terminals, for example. It is noted that the external connection terminals 95 are inserted into corresponding holes formed in a printed circuit board, and pass various signals used at the time of normal operation. In other words, signals necessary for the evaluation do not pass through the external connection terminals 95. Conductive pads 97 are arranged on the layer 91-2 of the bonding wire layer 91, and connected to internal connection lines 98 formed in the wire bonding layer 91. The conductive pads 97 are arranged along the four ends, or edges, of the package body 100, and are partially disposed in a two-column arrangement (see FIG. 7A).

The metallized insulating cap 92 consists of three stacked layers 92-1, 92-2 and 92-3, each of which is formed of ceramics such as alumina. Through holes 92a and internal connection lines 92b are formed in the metallized insulating cap 92. Conductive pads 99 are formed on the layer 92-1 of the metallized insulating cap 92 so as to have the same arrangement as the conductive pads 97 formed on the layer 91-2 of the wire bonding layer 91. The metallized insulating cap 92 is mounted on the package body 100 in such a way that the conductive pads 99 are laid on the corresponding pads 97. A conductive adhesive 101 such as Pb/Sn, Au/Sn and Ag paste is provided around the conductive pads 97 and 99, whereby the metallized insulating cap 92 is fastened to the package body 100. External connection terminals 102 including evaluation dedicated terminals 102-2 and power supply terminals 102-1 are provided on the layer 92-3 of the metallized insulating cap 92 so as to project elevationally (i.e., normally, or perpendicularly) therefrom. For example, the external connection terminals 102 consist of 64 terminals arranged in the form of a matrix. The external connection terminals 102 are electrically connected to related conductive pads 99 through the internal connection lines 92b. It is noted that the evaluation dedicated terminals 102-2, of the external connection terminals 102, are specifically used for the evaluation (debugging), or in other words, are independent of the external connection terminals 95. The power supply terminals 102-1, which are disposed in the four corners of the arrangement, are electrically connected to the corresponding power supply terminals, of the external connection terminals 95 through internal connection lines 92b and 98 respectively formed in the metallized insulating cap 92 and the package body 100.

Figure 8A:
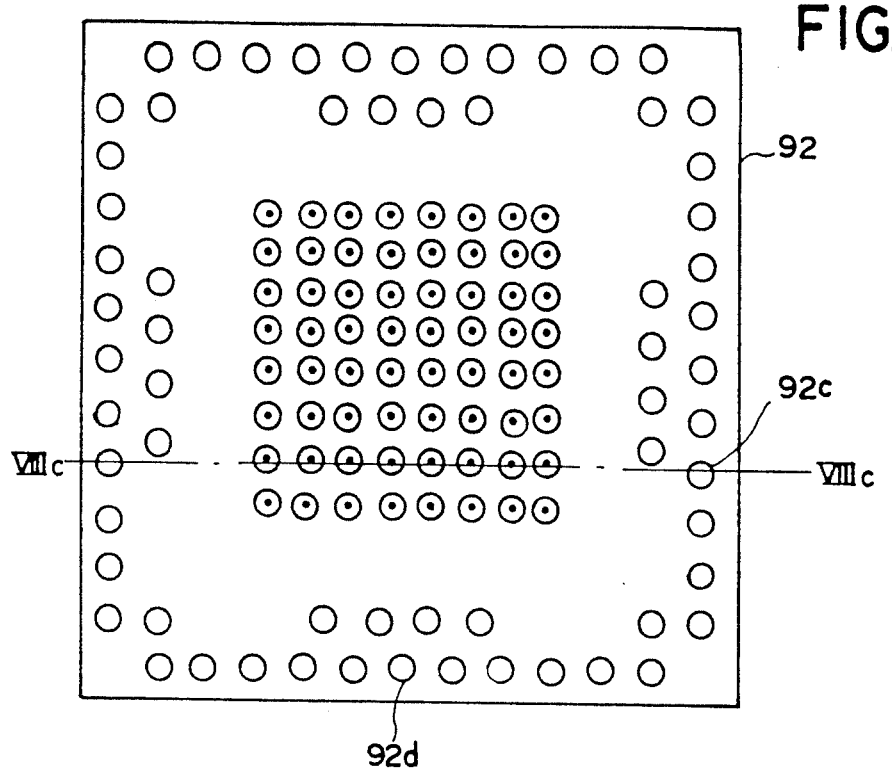
FIG. 8A is a plan view of a variation of the metallized insulating cap used in the second embodiment.
Figure 8B:
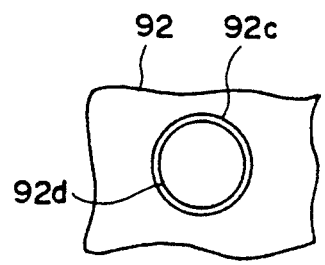
FIG. 8B is an enlarged plan view illustrating a through hole which is formed in the metallized insulating cap shown in FIG. 8A and has a conductive plating layer formed in the through hole.
Figure 8C:
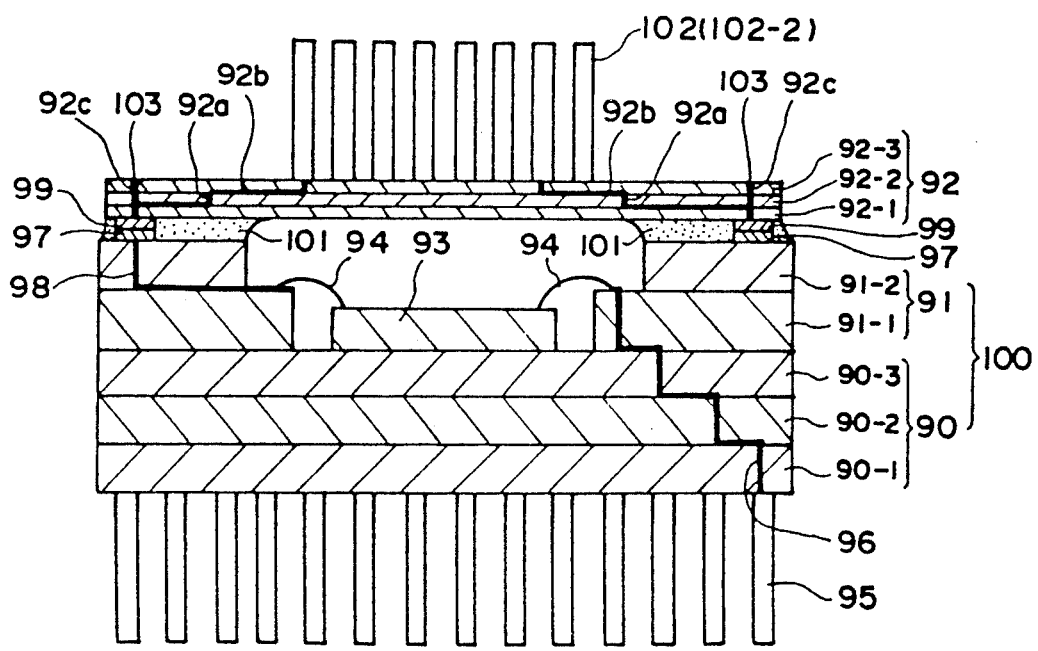
FIG. 8C is a cross sectional view taken along the line $VIII_C$—$VIII_C$ shown in FIG. 8A, in which the metallized insulating cap of FIG. 8A and the package body of FIG. 7A are assembled.

A variation of the metallized insulating cap 92 is illustrated in FIG. 8A. The variation of the metallization layer 92 has through holes 92c positioned so as to have the same arrangement as the conductive pads 97 of the package body 100 shown in FIG. 7B. As shown in FIG. 8B, a conductive plating 92d is formed on the inner, or interiors, wall of each of the through holes 92c. The conductive plating 92d relating to each of the through holes 92c is connected to the related conductive pad 99. In the assembled state shown in FIG. 8C, each of the through holes 92c, having the conductive plating 92d, further is filled with a conductive material 103. Thereby, it becomes possible to more securely establish the electrical connection between the conductive pads 97 and 99.

Figure 9:
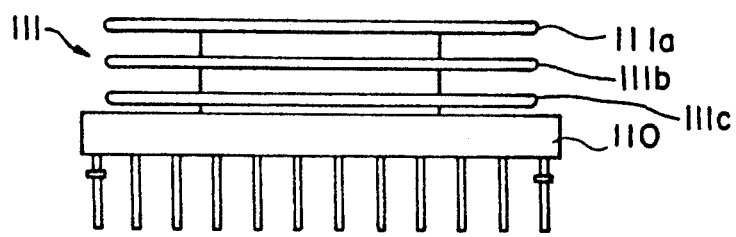
FIG. 9 is a side view of an integrated circuit device which is mass-produced after evaluating an integrated circuit chip by using the package structure shown in FIGS. 7A through 7C.

After evaluating the chip 93 accommodated in the aforementioned package structure, an integrated circuit device having a package structure shown in FIG. 9 is mass-produced. A package 110 has a package body identical to the package body 100 (FIG. 7C), and a ceramic lid layer, which is substituted for the metallized insulating cap 92 (FIG. 7C), is provided so as to hermetically seal the chip 93. A heat sink or fin structure 111, having a plurality of spaced fins 111a, 111b, . . . is mounted on the package 110.

The aforementioned stacked layers may be constructed in a known manufacturing method. For example, through holes and internal connection lines are formed in ceramic sheets before being subjected to sintering (green sheets). Next, the green sheets are stacked and then divided into a plurality of pieces. Then the pieces are sintered.

The present invention is not limited to the aforementioned embodiments, and variations and modifications may be made without departing from the scope of the present invention.

What is claimed is:

1. An integrated circuit device comprising:
   a semiconductor integrated circuit chip;
   a package body having first and second surfaces and first and second pluralities of internal connection lines, said semiconductor integrated circuit chip being mounted on the first surface of said package body;
   a first group of plural external connection terminals provided on the first surface of said package body, said first group of plural external connection terminals being electrically connected to said semiconductor integrated circuit chip through respective, said first plurality of internal connection lines for passing therethrough corresponding signals of a first type;
   a second group of plural external connection terminals, each having a pin-shaped structure, provided on the second surface of said package body in a matrix arrangement, said second group of plural external connection terminals being electrically connected to said semiconductor integrated circuit chip through respective, said second plurality of internal connection lines, predetermined terminals of said second group of plural external connection terminals specifically passing therethrough corresponding signals of a second type, to be supplied to or from said semiconductor integrated circuit chip at the time of and for evaluating said semiconductor integrated circuit chip, said signals of the second type differing from said signals of the first type; and
   said predetermined terminals of said second group of plural external connection terminals not being connected electrically to, and being electrically isolated from, said first group of plural external connection terminals.

2. An integrated circuit device as claimed in claim 1, wherein said plural external connection terminals of said second group are arranged in the form of a matrix comprising at least two rows and two columns, each said row and each said column comprising plural said external connection terminals, said row extending generally perpendicularly to said columns.

3. An integrated circuit device as claimed in claim 1, wherein said second group of plural external connection terminals includes plural power supply terminals in addition to said predetermined terminals.

4. An integrated circuit device as claimed in claim 3, wherein said plural power supply terminals are located in respectively corresponding corners of the matrix arrangement of said second group of plural external connection terminals.

5. An integrated circuit device as claimed in claim 3, wherein said first group of plural external connection terminals includes plural power supply terminals, said plural power supply terminals of said second group being electrically connected to respective, said plural power supply terminals of said first group.

6. An integrated circuit device as claimed in claim 1, wherein said plural external connection terminals of said second group project normally from said second surface of said package body.

7. An integrated circuit device as claimed in claim 1, wherein said package body further comprises:
 a chip mounting layer defining said first surface of said package body, said semiconductor integrated circuit chip being mounted on said chip mounting layer, a wire bonding layer mounted on said chip mounting layer, plural bonding pads formed on said bonding layer, and plural bonding wires respectively connecting said plural bonding pads to said semiconductor integrated circuit chip;
 a metallized insulating layer contacting said chip mounting layer and defining said second surface of said package body, said second group of plural external connection terminals being provided on said metallized insulating layer; and
 said first plurality of internal connection lines being formed in said chip mounting layer and said wire bonding layer, and said plurality of internal connection lines being formed in said metallized insulating layer.

8. An integrated circuit device as claimed in claim 7, wherein said metallized insulating layer comprises a plurality of stacked layers.

9. An integrated circuit device as claimed in claim 7, wherein said metallized insulating layer comprises an insulating material on and in which said second group of plural internal connection lines is formed.

10. An integrated circuit device as claimed in claim 1, further comprising a cap affixed to said first surface of said package body so as to hermetically seal said semiconductor integrated circuit chip within said package body.

11. An integrated circuit device as claimed in claim 1, wherein said semiconductor integrated circuit chip comprises an application specific integrated circuit.

12. An integrated circuit device as claimed in claim 1, wherein said semiconductor integrated circuit chip comprises a digital signal processor.

13. An integrated circuit device comprising:
 a semiconductor integrated circuit chip;
 a package body having first and second surfaces and first, second, and third pluralities of internal connection lines, said semiconductor integrated circuit chip being mounted on the first surface of said package body;
 a first group of plural external connection terminals provided on said second surface of said package body, said first group of plural external connection terminals being electrically connected to said semiconductor integrated circuit chip through respective, said first plurality of internal connection lines for passing therethrough corresponding signals of a first type;
 a metallized insulating cap having first and second surfaces, said cap being mounted on said package body so that the first surface of said metallized insulating cap faces the first surface of said package body;
 said third plurality of internal connection lines extending through said metallized insulating cap between said first and second surfaces thereof;
 a second group of plural external connection terminals, each having a pin-shaped structure, arranged in a matrix and mounted on and projecting normally from the second surface of said metallized insulating cap and electrically connected to said semiconductor integrated circuit chip through respective, said second and third pluralities of internal connection lines;
 predetermined terminals of said second group of plural external connection terminals specifically passing therethrough corresponding signals of a second type to be supplied to or from said semiconductor integrated circuit chip at the time of evaluating said semiconductor integrated circuit chip, said signals of the second type differing from said signals of the first type; and
 said predetermined terminals of said second group of plural external connection terminals not being connected electrically to, and being electrically isolated from, said first group of plural external connection terminals.

14. An integrated circuit device as claimed in claim 13, wherein:
 said package body comprises plural first conductive pads formed on the first surface thereof and connected to said second internal connection lines; and
 said metallized insulating cap comprises plural second conductive pads formed on the first surface thereof and respectively connected to said third plurality of internal connection lines, said metallized insulating cap being mounted on said package body so that said plural second conductive pads contact respective, said plural first conductive pads.

15. An integrated circuit device as claimed in claim 14, wherein said metallized insulating cap is fastened to said package body by a conductive adhesive formed around each of said first and second conductive pads.

16. An integrated circuit device as claimed in claim 14, wherein said first and second conductive pads are disposed in the same arrangement pattern.

17. An integrated circuit device as claimed in claim 13, wherein the first surface of said package body is formed stepwise, and said semiconductor integrated circuit chip is mounted on a bottom portion of said first surface of said package body.

18. An integrated circuit device as claimed in claim 13, wherein said metallized insulating cap comprises a plurality of stacked layers each formed of an insulating material, each said layer having first and second surfaces and through holes extending therethrough and said third internal connection lines being formed on and extending along said surfaces of said layers and through said through holes.

19. An integrated circuit device as claimed in claim 13, wherein said signals of the second type passing through said predetermined terminals of said second group of plural external connection terminals are signals used at the time of evaluating said semiconductor integrated circuit chip.

20. An integrated circuit device as claimed in claim 13, wherein said second group of plural external connection terminals includes plural power supply terminals in addition to said predetermined terminals.

21. An integrated circuit device as claimed in claim 20, wherein said plural external connection terminals of said second group are arranged in the form of a matrix, and said plural power supply terminals are located in respectively corresponding corners of the matrix arrangement of said second group of plural external connection terminals.

22. An integrated circuit device as claimed in claim 20, wherein said first group of plural external connection terminals includes plural power supply terminals, said plural power supply terminals of said second group being electrically connected to respective, said plural power supply terminals of said first group through respectively corresponding ones of said first, second and third internal connection lines.

23. An integrated circuit device as claimed in claim 13, wherein said semiconductor integrated circuit chip comprises an application specific integrated circuit.

24. An integrated circuit device as claimed in claim 13, wherein said semiconductor integrated circuit chip comprises a digital signal processor.

25. An integrated circuit device as claimed in claim 14, wherein said metallized insulating cap includes plural through holes therein, said plural through holes and said second conductive pads being arranged in corresponding patterns, and each of said through holes being provided with a conductive plating on the respective sidewalls thereof, the conductive plating of each said through hole being electrically connected to a related one of said plural, second conductive pads.

26. An integrated circuit device as claimed in claim 25, wherein each of said through holes, in addition to having conductive plating on the sidewalls thereof, is filled with conductive material electrically contacting said related one of said plural second conductive pads.

* * * * *

UNITED STATES PATENT AND TRADEMARK OFFICE
CERTIFICATE OF CORRECTION

PATENT NO. : 5,041,899
DATED : August 20, 1991
INVENTOR(S) : OKU et al.

It is certified that error appears in the above-identified patent and that said Letters Patent is hereby corrected as shown below:

Col. 4, line 17, change "ceramics" to --ceramic--;
line 31, change "ceramics" to --ceramic--, and change "served a" to --serving as--;
line 41, after "therefrom" insert --,--;
line 66, after "formed" delete ",".

Col. 5, line 36, change "or" to --and--;
line 37, chagne "and" (first occurrence) to --or--.

Col. 7, line 52, after "terminals" insert --,--;
line 62, change "interiors" to --interior--.

Signed and Sealed this

Twenty-fourth Day of August, 1993

Attest:

BRUCE LEHMAN

Attesting Officer

Commissioner of Patents and Trademarks